United States Patent [19]

Sakakura et al.

[11] Patent Number: 5,368,216
[45] Date of Patent: Nov. 29, 1994

[54] CAPILLARY-RETAINING STRUCTURE FOR AN ULTRASONIC HORN

[75] Inventors: Mitsuaki Sakakura, Saitama; Yuji Tanaka; Junkichi Enomoto, both of Tokyo; Syoji Ito, Tokyo, all of Japan

[73] Assignee: Kabushiki Kaisha Shinkawa, Tokyo, Japan

[21] Appl. No.: 156,109

[22] Filed: Nov. 22, 1993

[30] Foreign Application Priority Data

Nov. 24, 1992 [JP] Japan ................... 4-334938

[51] Int. Cl.⁵ ............. B23K 20/10; H01L 21/607
[52] U.S. Cl. ........................ 228/1.1; 228/4.5; 228/55; 156/73.2; 156/580.1
[58] Field of Search ........... 228/1.1, 4.5, 55, 110.1, 228/180.5, 904; 156/73.2, 379.6, 580.1

[56] References Cited

U.S. PATENT DOCUMENTS

| | | | |
|---|---|---|---|
| 3,384,283 | 5/1968 | Mims | 228/110.1 |
| 5,180,093 | 1/1993 | Stansbury et al. | 228/1.1 |
| 5,207,369 | 5/1993 | Haji et al. | 228/4.5 |
| 5,275,324 | 1/1994 | Yamazaki et al. | 228/1.1 |

*Primary Examiner*—Samuel M. Heinrich
*Attorney, Agent, or Firm*—Koda and Androlia

[57] ABSTRACT

A capillary-retaining structure for an ultrasonic horn used in a wire bonding apparatus including a stress relief hole formed inside of a capillary attachment hole that is opened at an end portion of the ultrasonic horn. Thus, the capillary retention by the ultrasonic horn is stabilized, and the vibrational characteristics of the ultrasonic horn are also stabilized, thus improving overall bondability in wire bonding. The same effect can be obtained by setting the thickness of a portion between the end surface of the horn and the capillary attachment hole to be thin or by utilizing a bold and nut combination to hold the capillary.

6 Claims, 5 Drawing Sheets

CAPILLARY-RETAINING STRUCTURE FOR AN ULTRASONIC HORN

BACKGROUND OF THE INVENTION

1. Field of the Invention

The present invention relates to a capillary-retaining structure for an ultrasonic horn of a wire bonding apparatus.

2. Prior Art

Some wire bonding apparatuses use ultrasonic horns. In these apparatuses, a capillary is attached to the ultrasonic horn, and the ultrasonic horn is moved vertically and horizontally so that a bonding wire passing through the capillary is connected between the electrodes of semiconductor pellets and the lead posts of external leads.

One example of the conventional capillary-retaining structure used in an ultrasonic horn is shown in FIG. 5.

The ultrasonic horn 10 is provided at its end portion with a capillary attachment hole 11 which holds a capillary 30. A slit 12 is formed so as to extend from the tip end to the inside of the ultrasonic horn 10. The slit 12 is oriented perpendicular to the axis of the capillary attachment hole 11. A screw hole 13 into which an attachment screw 31 is inserted is formed in the ultrasonic horn 10 so that it is on one side of the slit 12. In addition, a threaded hole 14 with which the attachment screw 31 is screw engaged is formed concentrically with the screw hole 13 so that the threaded hole 14 is located on the other side of the slit 12.

Accordingly, when the attachment screw 31 is tightened, the slit 12 is narrowed and the capillary 30 in the attachment hole 11 is retained by the ultrasonic horn 10. When the wire (not shown in the drawing) which passes through the capillary 30 is going to be bonded to the electrodes of semiconductor pellets and the lead posts of external leads, ultrasonic waves are applied to the ultrasonic horn 10 from an ultrasonic vibrator (not shown) so that the capillary 30 is vibrated.

However, the prior art described above has problems. When the attachment screw 31 is tightened, the resulting stress is concentrated around the threaded hole 14 of the ultrasonic horn 10. As a result, the area 15 of the threaded hole 14 that is located near the slit 12 is warped toward the capillary 30, and the retention of the capillary 30 becomes unstable. If the retention of the capillary 30 is unstable, the vibrational characteristics of the ultrasonic horn 10 become unstable, and the bondability deteriorates.

SUMMARY OF THE INVENTION

Accordingly, the object of the present invention is to provide a capillary-retaining structure for an ultrasonic horn of a wire bonding apparatus that provides stable capillary retention and stable vibrational characteristics of the ultrasonic horn, thus improving bondability.

The object of the present invention is accomplished by a unique structure for an ultrasonic horn capillary-retaining structure used in a wire bonding apparatus in which a capillary attachment hole which holds a capillary is formed at the one end of an ultrasonic horn, a slit is formed so as to extend from the end surface to inside of the horn and perpendicular to the ultrasonic horn, a screw hole into which an attachment screw is inserted is formed in the ultrasonic horn so as be to located on one side of the slit, a threaded hole into which the attachment screw is screw engaged is formed concentrically with the screw hole so as to be located on the other side of the slit, and the capillary is retained in the ultrasonic horn by tightening the attachment screw in the screw hole so as to be screw engaged with the threaded hole, and in addition, a stress relief hole is provided inside the capillary attachment hole at a position corresponding to the attachment screw.

The object of the present invention is accomplished by another unique structure for an ultrasonic horn capillary-retaining structure used in a wire bonding apparatus in which a capillary attachment hole which holds a capillary is formed at one end of an ultrasonic horn, a slit is formed so as to extent from the end surface to inside of the horn and perpendicular to the ultrasonic horn, a screw hole into which an attachment screw is inserted is formed in the ultrasonic horn so as to locate on one side of the slit, a threaded hole into which the attachment screw is screw engaged is formed concentrically with the screw hole so as to locate on the other side of the slit, and the capillary is retained in the ultrasonic horn by tightening the attachment screw in the screw hole so as to be screw engaged with the threaded hole, and in addition, the tip end of the ultrasonic horn is provided with a recessed surface at the middle portion so that the thickness of the area defined between the tip end of the horn and the capillary attachment hole is small at the middle.

The object of the present invention is accomplished by still another unique structure for an ultrasonic horn capillary-retaining structure used in a wire bonding apparatus in which a capillary attachment hole which holds a capillary is formed at one end of an ultrasonic horn, and a slit is formed so as to extend from the end surface to inside of the horn and perpendicular to the ultrasonic horn, and in addition, a screw hole is opened in the ultrasonic horn so as to run through the ultrasonic horn, a nut-receiving recess is formed on the side surface of the ultrasonic horn so as to positionally correspond to the screw hole, so that the capillary is retained in the ultrasonic horn by inserting the attachment screw into the screw hole and a nut in the nut-receiving recess is screwed to the attachment screw.

According to the first structure of the present invention, strain caused by stress concentrated at a portion of the threaded hole that is near the slit is absorbed by the stress relief hole, so that there is no effect of the strain on the capillary. Accordingly, the retention of the capillary is stabilized. In addition, with the stress relief hole formed around the entire inner circumference of the capillary attachment hole, the capillary is retained by the upper and lower portions of the inner surface of the capillary attachment hole. Thus, the retention of the capillary is further stabilized.

According to the second structure of the present invention, the middle portion of the tip end of the ultrasonic horn is formed thin. Accordingly, strain caused by stress concentrated at the portion of the threaded hole located near the slit (in other words, the strain that would occur when the attachment screw is tightened) applies a weaker pressing force against the capillary than the upper and lower portions of the capillary attachment hole do. As a result, the capillary is held at the tip portion of the ultrasonic horn mainly by the upper and lower portions of the inner surface of the capillary attachment hole, and the retention of the capillary is stabilized.

According to the third structure of the present invention, the tightening stress of the attachment screw is dispersed in the nut-receiving recess which is in contact with the nut. Accordingly, no local deformation occurs in the area around the capillary attachment hole, and the diameter of the capillary attachment hole becomes uniformly smaller; thus the retention of the capillary is stabilized.

DETAILED DESCRIPTION OF THE INVENTION

Figure 5A:
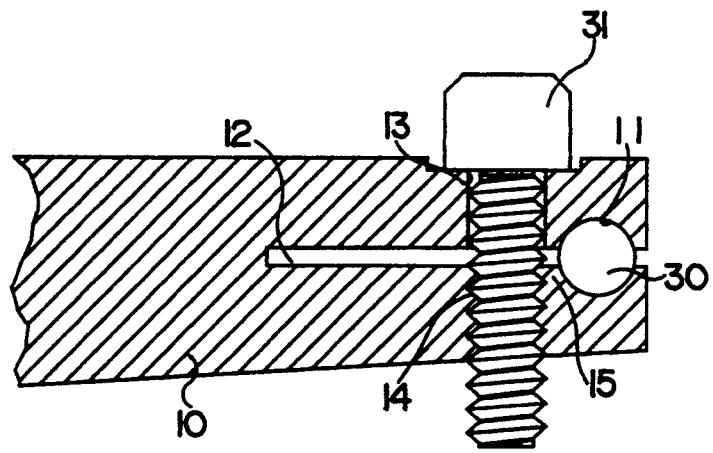
FIGS. 5a and 5b illustrate the tip portion of the conventional ultrasonic horn, FIG. 5a being a horizontal cross section thereof, and FIG. 5b being a vertical cross section thereof.
Figure 5B:
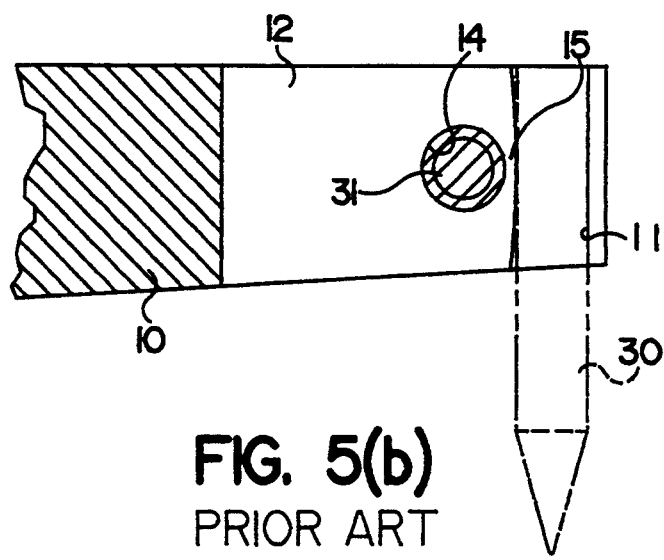

The first embodiment of the present invention will be described with reference to FIGS. 1a and 1b. The components which are the same as those shown in FIGS. 5a and 5b are given the same reference numerals and will not be described in detail.

Figure 1A:
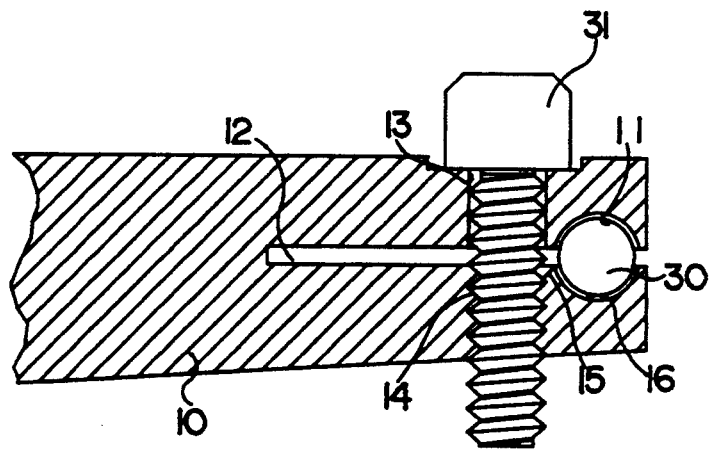
FIGS. 1a and 1b illustrate the tip portion of the ultrasonic horn of a first embodiment of the present invention, FIG. 1a being a horizontal cross section thereof, and FIG. 1b being a vertical cross section thereof.
Figure 1B:
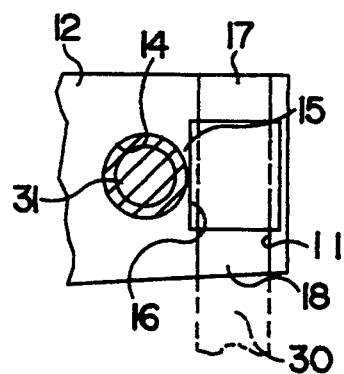

As seen in FIGS. 1a and 1b, a stress relief hole 16 which is larger in diameter than the capillary attachment hole 11 is formed in approximately the middle portion (in a vertical direction as seen in FIG. 1b) of the capillary attachment hole 11. In other words, the stress relief hole 16 is provided inside the attachment hole 11 so that it positionally corresponds to the attachment screw 31. More specifically, as seen from FIG. 1b, the diameter of the stress relief hole 16 is slightly larger than that of the attachment hole, and the height of the stress relief hole 16 is slightly larger than the diameter of the screw portion of the attachment screw 31.

Accordingly, strain caused by stress concentrated at an intermediate area 15 of the threaded hole 14 that locates near the slit 12 is absorbed by this stress relief hole 16, and no effect of stress can act on the capillary 30 which is in the attachment hole 11 and tightened by the attachment screw 31. As a result, the retention of the capillary 30 in the attachment hole 11 can be stabilized. In addition, the capillary 30 is held by the upper portion 17 and the lower portion 18 of the inner surface of the capillary attachment hole 11; accordingly, the retention of the capillary 30 is stabilized in this regard as well.

Figure 2A:
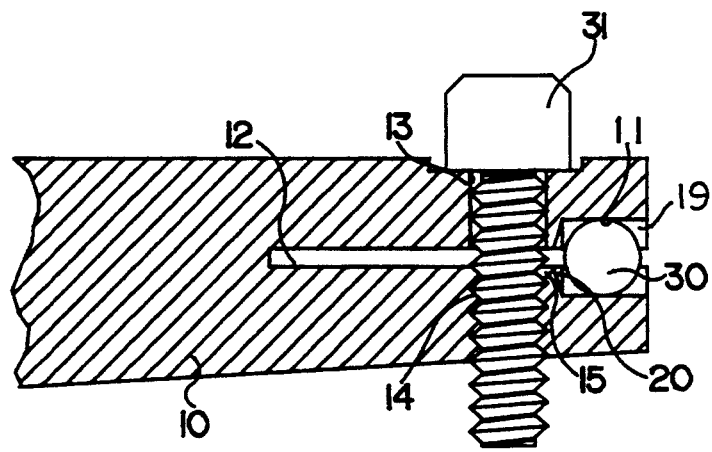
FIGS. 2a and 2b illustrate the tip portion of the ultrasonic horn of a second embodiment of the present invention, FIG. 2a being a horizontal cross section thereof, and FIG. 2b being a vertical cross section thereof.
Figure 2B:
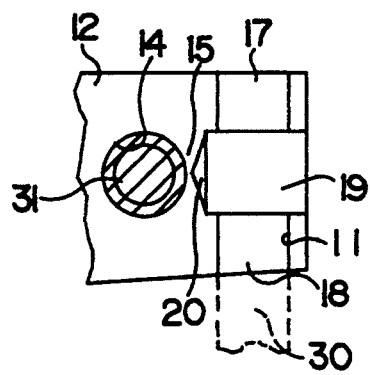

FIGS. 2a and 2b illustrate the second embodiment of the present invention.

In this embodiment, as best seen in FIG. 2b, a horizontal hole 19 is opened from the tip end of the ultrasonic horn 10 so that it runs toward the attachment screw 31. The inner most end of the horizontal hole 19 is set so as to be closer to the attachment screw 31 than the capillary attachment hole 11. Accordingly, the end portion 20 of the horizontal hole 19 that locates close to the attachment screw 31 can act as a stress relief hole.

In this construction, as in the previous embodiment shown in FIGS. 1a and 1b, strain caused by stress concentrated at the intermediate area 15 near the slit 12 is absorbed by the end portion 20 of the horizontal hole 19, and no effect of strain can act on the capillary 30. Accordingly, the retention of the capillary 30 is stabilized. In addition, the capillary 30 is retained by the upper portion 17 and the lower portion 18 of the inner surface of the capillary attachment hole 11; accordingly, the retention of the capillary 30 is stabilized in this regard as well.

Figure 3A:
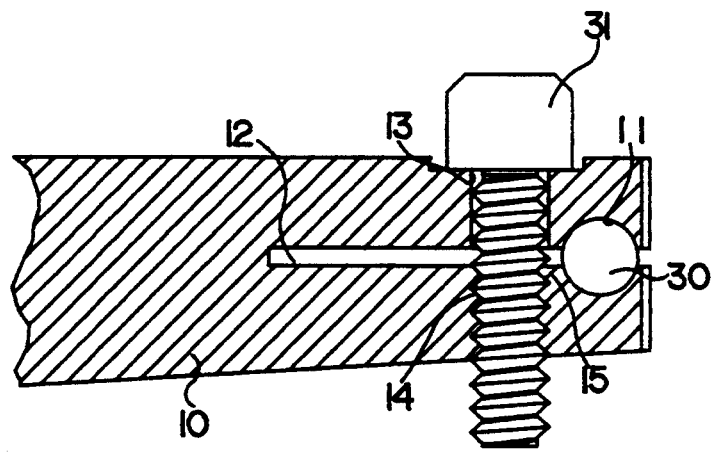
FIGS. 3a and 3b illustrate the tip portion of the ultrasonic horn of a third embodiment of the present invention, FIG. 3a being a horizontal cross section thereof, and FIG. 3b being a vertical cross section thereof.
Figure 3B:
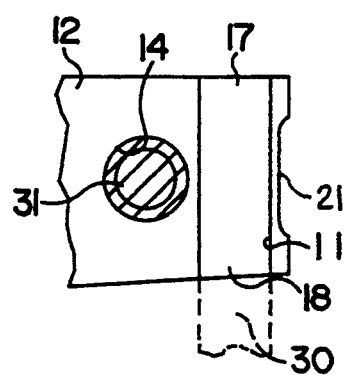

FIGS. 3a and 3b illustrate a third embodiment of the present invention.

In this embodiment, as best seen in FIG. 3b, a recessed surface is formed at vertically a middle portion of the tip end of the ultrasonic horn 10. In other words, the area defined between the tip end surface of the horn 10 and the capillary attachment hole 11 is designed small in thickness.

Since the middle portion of the tip end of the ultrasonic horn 10 is thus recessed, strain caused by stress concentrated at the intermediate area 15 of the threaded hole 14 near the slit 12 (in other words, the stress generated when the attachment screw 31 is tightened) applies a weaker pressing force against the capillary 30 than the upper and lower portions 17 and 18 of the capillary attachment hole 11 do. Accordingly, the capillary 30 is retained in the ultrasonic horn 10 mainly by the upper and lower portions 17 and 18 of the capillary attachment hole 11, and the retention of the capillary 30 is stabilized.

Figure 4A:
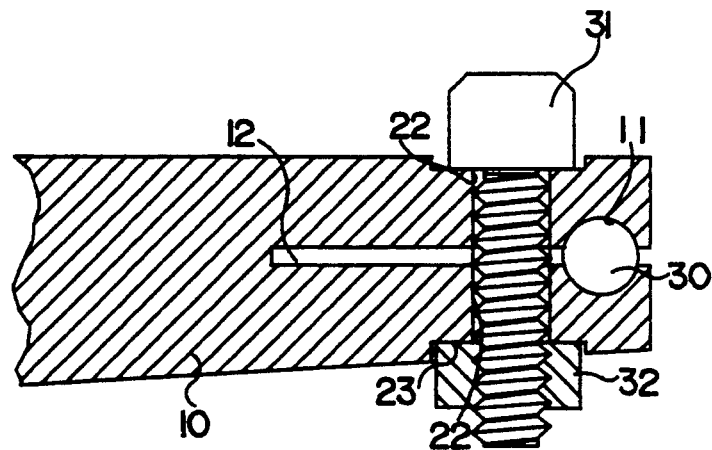
FIGS. 4a and 4b illustrate the tip portion of the ultrasonic horn of a fourth embodiment of the present invention, FIG. 4a being a horizontal cross section thereof, and FIG. 4b being a vertical cross section thereof.
Figure 4B:
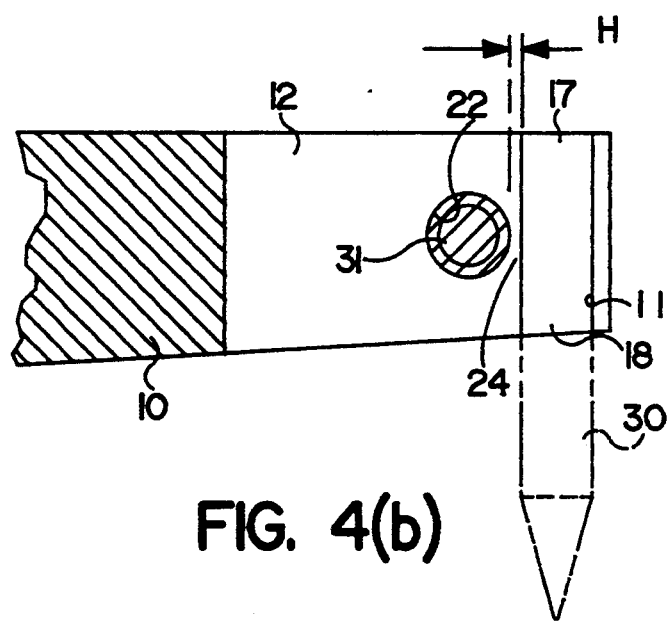

FIGS. 4a and 4b illustrate a fourth embodiment of the present invention.

In this embodiment, as best seen in FIG. 4a, a screw hole 22 into which the attachment screw 31 is inserted is opened all the way through the ultrasonic horn 10 (with no threaded hole 14 formed). In addition, a nut-receiving recess 23 is formed on one side surface of the ultrasonic horn 10 so as to correspond in position to the screw hole 22.

With the above structure, the capillary 30 in the attachment hole 11 is held by a tightening action accomplished by screwing a nut 32 onto the attachment screw 31 inserted into the screw hole 22.

In this embodiment, the tightening stress of the attachment screw 31 is dispersed in the area of the nut-receiving recess 23 that is in contact with the nut 32. Accordingly, local deformation around the capillary attachment hole 11 is eliminated, and the diameter of the capillary attachment hole 11 can become uniformly smaller. As a result, the retention of the capillary 30 is stabilized.

Furthermore, the thickness of an intermediate area 24 located between the capillary attachment hole 11 and the screw hole 22 can be set small. In other words, the shortest distance H between the capillary attachment hole 11 and the screw hole 22 can be set 0.19 mm or less. In this case, when the capillary 30 is tightened by the attachment screw 31, the stress applied from the thin intermediate area 24 to the capillary 30 can be small. Thus, the capillary 30 is held by the upper portion 17 and the lower portion 18 of the inner surface of the capillary attachment hole 11, and an even greater stabilization of the retention of the capillary 30 is obtained.

As seen from the above, according to the present invention, a stress relief hole is formed as a part of the capillary attachment hole at a position that corresponds to the attachment screw, or the middle portion of the tip end of the ultrasonic horn is formed recessed. In addition, a screw hole which runs (horizontally) through the ultrasonic horn is formed in the ultrasonic horn and a nut-receiving recess is formed on the side surface of the ultrasonic horn, and the capillary in the ultrasonic horn is held by a tightening action which is accomplished by inserting the attachment screw into the screw hole and screwing the attachment screw into the nut set in the nut-receiving recess. Accordingly, a stable retention of the capillary is obtained, and the vibrational characteristics of the ultrasonic horn can be stabilized, thus improving the bondability in wire bonding.

We claim:

1. A capillary-retaining structure for an ultrasonic horn used in a wire bonding apparatus comprising: a capillary attachment hole formed in one end portion of an ultrasonic horn and holds a capillary, a slit formed perpendicular to said capillary attachment hole extending from a surface of said one end, a screw hole which is formed in said ultrasonic horn so as to be on one side of said slit and into which an attachment screw is inserted, a threaded hole which is formed concentrically with said screw hole so as to be on another side of said slit and with which said attachment screw is screw engaged, and a capillary retained in said ultrasonic horn by screw engaging said attachment screw with said threaded hole, wherein a stress relief hole is formed at a part inside of said capillary attachment hole so as to correspond to said attachment screw.

2. A capillary-retaining structure according to claim 1, wherein said stress relief hole is coaxial with and larger in diameter than said capillary attachment hole.

3. A capillary-retaining structure according to claim 1, wherein said stress relief hole is a horizontal hole extending from a tip end of said ultrasonic horn toward said attachment screw.

4. A capillary-retaining structure for an ultrasonic horn used in a wire bonding apparatus comprising: a capillary attachment hole formed in one end portion of an ultrasonic horn and holds a capillary, a slit formed perpendicular to said capillary attachment hole extending from a surface of said one end, a screw hole which is formed in said ultrasonic horn so as to be on one side of said slit and into which an attachment screw is inserted, a threaded hole which is formed concentrically with said screw hole so as to be on another side of said slit and with which said attachment screw is screw engaged, and a capillary retained in said ultrasonic horn by screw engaging said attachment screw with said threaded hole, wherein a central portion of said tip end surface of said ultrasonic horn is formed as a thin part of a reduced thickness.

5. A capillary-retaining structure for an ultrasonic horn used in a wire bonding apparatus comprising: a capillary attachment hole which is formed in one end portion of an ultrasonic horn and holds a capillary, and a slit formed perpendicular to said capillary attachment hole extending from a tip end surface of said ultrasonic horn, wherein a screw hole is formed in one side surface of said ultrasonic horn so that said screw hole runs through said ultrasonic horn, a nut-receiving recess is formed in another side surface of said ultrasonic horn at a position corresponding to said screw hole, and a capillary is retained in said ultrasonic horn by a tightening action accomplished by inserting an attachment screw into said screw hole and screwing said attachment screw into a nut positioned in said nut-receiving recess.

6. A capillary-retaining structure according to claim 4, wherein a shortest distance between said capillary attachment hole and said screw hole is 0.19 mm or less.

* * * * *